United States Patent
Katagiri et al.

(10) Patent No.: US 7,615,765 B2
(45) Date of Patent: Nov. 10, 2009

(54) CHARGED PARTICLE BEAM APPARATUS

(75) Inventors: Souichi Katagiri, Kodaira (JP); Takashi Ohshima, Saitama (JP); Toshihide Agemura, Hitachinaka (JP); Mitsugu Sato, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 543 days.

(21) Appl. No.: 11/589,821

(22) Filed: Oct. 31, 2006

(65) Prior Publication Data

US 2007/0102650 A1  May 10, 2007

(30) Foreign Application Priority Data

Nov. 10, 2005 (JP) ............................. 2005-325559
May 8, 2006 (JP) ............................. 2006-128962

(51) Int. Cl.
*A61N 5/00* (2006.01)
*G21G 5/00* (2006.01)

(52) U.S. Cl. .................... 250/492.3; 250/492.1; 313/7; 313/311; 313/545; 313/561; 417/48; 417/51

(58) Field of Classification Search ............. 250/492.1, 250/492.3, 396 R, 398, 306, 307, 309, 310; 313/7, 311, 545, 561; 417/47, 48, 51
See application file for complete search history.

(56) References Cited

U.S. PATENT DOCUMENTS 4,833,362 A   5/1989  Crewe 7,053,589 B2 *   5/2006  Gabrys et al. ............... 74/572.1
2004/0051507 A1 *   3/2004  Gabrys et al. .................. 322/4
2005/0052103 A1 *   3/2005  Katagiri et al. ................. 313/7
2007/0102650 A1 *   5/2007  Katagiri et al. ........... 250/492.3
2008/0315122 A1 *  12/2008  Katagiri et al. ........... 250/492.1

FOREIGN PATENT DOCUMENTS

| JP | 6-111745 | 4/1994 |
| JP | 2000-149850 | 5/2000 |
| JP | 2002-358920 | 12/2002 |
| JP | 2004-202309 | 7/2004 |

* cited by examiner

*Primary Examiner*—Bernard E Souw
(74) *Attorney, Agent, or Firm*—Mattingly & Malur, P.C.

(57) ABSTRACT

There is provided a compact charged particle beam apparatus with a non-evaporable getter pump which maintains high vacuum even during emission of an electron beam without generating foreign particles. The apparatus comprises: a charged particle source; a charged particle optics which focuses a charged particle beam emitted from the charged particle source on a sample and performs scanning; and means of vacuum pumping which evacuates the charged particle optics. The means of vacuum pumping has a differential pumping structure with two or more vacuum chambers connected through an opening in series. A pump made of non-evaporable getter alloy is placed in an upstream vacuum chamber with a high degree of vacuum, and a gas absorbing surface of the non-evaporable getter alloy is fixed without contact with another part.

20 Claims, 16 Drawing Sheets

CHARGED PARTICLE BEAM APPARATUS

CLAIM OF PRIORITY

The present invention claims priority from Japanese patent applications JP 2006-128962 filed on May 8, 2006, and JP 2005-325559 filed on Nov. 10, 2005, the contents of which are hereby incorporated by reference into this application.

BACKGROUND OF THE INVENTION

The present invention relates to charged particle beam apparatuses such as electron microscopes and focused ion beam systems.

A conventional scanning electron microscope (SEM) creates an image as follows: an electron beam emitted from an electron gun consisting of a field emitter or thermal field emitter electron source is accelerated and made a thin electron beam by an electron lens; this beam as a primary electron beam is scanned over a sample through a scanning deflector and generated secondary electrons or backscattered electrons are detected. The material of the electron source for a general-purpose SEM is tungsten. The material of the electron source for semiconductor observation may be tungsten which contains zirconia.

To ensure that the electron source emits a good quality electron beam for a long time, the area around the electron source must be maintained in a high vacuum condition ($10^{-7}$ to $10^{-8}$ Pa). For this purpose, as shown in FIG. 8, conventionally a plurality of ion pumps (three pumps IP-1, IP-2, IP-3 in the figure) has been used to evacuate the column by differential pumping. This method is disclosed in Japanese Patent Application Laid-Open No. 2002-358920. Although an ion pump has an advantageous that it has no movable part and can maintain the pressure $10^{-8}$ Pa or less simply by supplying power to it, its size is several dozen centimeters square or more and a magnetic shield is needed for the column (because it generates a magnetic field) and therefore its space requirement and weight are considerable.

One approach to a compact apparatus without ion pumps is disclosed in U.S. Pat. No. 4,833,362 and Japanese Patent Application Laid-Open No. 6-111745 where a non-evaporable getter pump is incorporated. As another approach, Japanese Patent Application Laid-Open No. 2000-149850 describes an electron gun which incorporates a getter ion pump, eliminating the need for conventional ion pumps.

A further approach described in Japanese Patent Application Laid-Open No. 2004-202309 is a non-evaporable getter pump in which non-evaporable getter alloy is placed in a space enclosed by a mesh in order to prevent generation of foreign particles and the mesh is finer than microparticles which are generated.

SUMMARY OF THE INVENTION

As mentioned above, when a field emitter electron gun is used, in order to achieve the required high vacuum level of $10^{-7}$ to $10^{-8}$ Pa, a differential pumping structure is adopted to evacuate each chamber by a pump dedicated to it. A non-evaporable getter pump is advantageous in terms of size reduction because it does not require an installation space like an ion pump and can be built in the column.

Here the non-evaporable getter pump means a vacuum pump which uses a getter alloy which absorbs gas simply by heating getter without evaporating it (for example, zirconium-vanadium alloy). For gas absorption, the gas should have a very low electric potential or be likely to have a chemical bond with getter alloy particles. This implies a problem that electrochemically stable gases such as rare gases and fluorocarbon are hardly removed because they are completely in equilibrium.

Furthermore, for an apparatus which uses a non-evaporable getter pump, in many cases getter alloy particles of 100 microns or less are made into porous pellets by sintering or deposited on a metal sheet (for example nichrome) in order to increase the pumping speed. Consequently there is a problem that getter alloy particles exposed on the surface might come off and become foreign particles, clogging an opening in an electron optics or they might be charged, causing an electric discharge.

An object of the present invention is to provide a compact charged particle beam apparatus with a non-evaporable getter pump in which high vacuum is maintained even during electron beam emission without generating foreign particles.

To achieve the above object, according to the present invention, a charged particle beam apparatus has an electron optics with a differential pumping structure in which a non-evaporable getter pump made of non-evaporable getter alloy is placed in an upstream vacuum chamber and a minimum required vacuum pump is placed in a downstream vacuum chamber under the conditions described below.

Preferably the vacuum pump should be a sputter ion pump with a high efficiency in rare gas removal or a noble ion pump. A remarkable effect of the use of such a pump is a substantial increase in the time for which high vacuum is maintained. A turbo-molecular pump may be used instead of an ion pump.

In placing a non-evaporable getter pump in the apparatus, the first point to note is that means to support the sheet getter pump should be designed to avoid contact of non-evaporable getter alloy with other parts (or hold it in a way not to contact anything). The second point is that if a pellet made by sintering fine particles of non-evaporable getter alloy is used, a small chamber should be provided on a column side wall and used as an auxiliary pump. Instead of fine particles of non-evaporable getter alloy, relatively large particles of about 3 mm square (bulk alloy) may be used. The use of such bulk alloy particles considerably reduces the possibility of generation of foreign particles upon contact. However, in this case, since surface area of the non-evaporable getter alloy is smaller, the pumping speed is lower. Taking the above advantage and disadvantage into consideration, grained getter alloy is held in a container partitioned by a mesh and placed in the vicinity of a typical built-in heater for a charged particle beam.

Furthermore, the space between the most downstream electron gun chamber and the sample chamber is sealed except an opening through which an electron beam passes. However, if an adequate level of conductance exists between the chambers, the need for an ion pump or turbo-molecular pump is completely able to eliminate.

Next, charged particle beam apparatuses according to preferred embodiments of the invention will be outlined.

According to one aspect of the invention, a charged particle beam apparatus comprises: a charged particle source; a charged particle optics which focuses a charged particle beam emitted from the charged particle source on a sample and performs scanning; and means of vacuum pumping which evacuates the charged particle optics. The means of vacuum pumping has a differential pumping structure with two or more vacuum chambers connected through an opening in series; a pump made of non-evaporable getter alloy is placed in an upstream vacuum chamber with a high degree of vacuum; and a gas absorbing surface of the non-evaporable getter alloy is fixed without contact with other parts.

According to a second aspect of the invention, in the above charged particle beam apparatus, the non-evaporable getter pump has a deposited non-evaporable getter alloy on one side of a metal sheet.

According to a third aspect of the invention, in the above charged particle beam apparatus, the non-evaporable getter pump is placed in the upstream vacuum chamber. The pump surface on which the non-evaporable getter alloy is deposited is on the vacuum side and the pump surface on which the non-evaporable getter alloy is not deposited is fixed in contact with an inner wall surface of the vacuum chamber with a high degree of vacuum.

According to a fourth aspect of the invention, in the above charged particle beam apparatus, the side of the non-evaporable getter pump on which non-evaporable getter alloy is deposited has some areas without non-evaporable getter alloy and means for fixations is provided on the area to be out of contact with non-evaporable getter alloy, and the pump is fixed in the upstream vacuum chamber.

According to a fifth aspect of the invention, in the above charged particle beam apparatus, an additional chamber for the upstream vacuum chamber is provided and pellets made by binding non-evaporable getter alloy particles are placed in the additional chamber.

According to a sixth aspect of the invention, in the above charged particle beam apparatus, a porous mesh is placed between the upstream vacuum chamber and the additional chamber.

According to a seventh aspect of the invention, in the above charged particle beam apparatus, a heater is located on the lower surface of the additional chamber.

According to an eighth aspect of the invention, in the above charged particle beam apparatus, a vacuum gauge is provided in the additional chamber.

According to a ninth aspect of the invention, in the above charged particle beam apparatus, an opening between the additional chamber and the upstream vacuum chamber is in a position higher than the pellets.

According to a tenth aspect of the invention, in the above charged particle beam apparatus, the means of vacuum pumping has a differential pumping structure which consists of three or more vacuum chambers connected through an opening in series; a pump made of non-evaporable getter alloy is placed in an upstream vacuum chamber with a high degree of vacuum; a vacuum chamber which lies downstream of the upstream vacuum chamber and has a lower degree of vacuum than the upstream vacuum chamber is connected with a vacuum chamber which lies downstream of the downstream vacuum chamber and has a lower degree of vacuum than the downstream vacuum chamber through a valve which is able to adjust flow rate; and a turbo-molecular pump is provided to evacuate the vacuum chamber which has the lowest degree of vacuum.

According to an eleventh aspect of the invention, a charged particle beam apparatus comprises: a charged particle source; a charged particle optics which focuses a charged particle beam emitted from the charged particle source on a sample and performs scanning; and means of vacuum pumping which evacuates the charged particle optics. The means of vacuum pumping has a differential pumping structure with two or more vacuum chambers connected through an opening in series; and a second pump made of grained non-evaporable getter alloy with particles on the order of less than 10 millimeters is placed in an upstream vacuum chamber with a high degree of vacuum.

According to a twelfth aspect of the invention, in the above charged particle beam apparatus, a first pump made of non-evaporable getter alloy with finer particles than the grained non-evaporable getter alloy is placed in a first vacuum chamber with a high degree of vacuum located most upstream, and a second pump made of the grained non-evaporable getter alloy is placed in a second vacuum chamber which is located downstream of the first vacuum chamber and has a lower degree of vacuum than the first vacuum chamber.

According to a thirteenth aspect of the invention, in the above charged particle beam apparatus, a gas absorbing surface of the non-evaporable getter alloy of the first pump is fixed without contact with other parts, and the non-evaporable getter alloy particles of the second pump are held around a heater by mesh texture metal.

According to a fourteenth aspect of the invention, in the above charged particle beam apparatus, the non-evaporable getter alloy of the second pump consists of particles of about 3 mm square.

According to a fifteenth aspect of the invention, in the above charged particle beam apparatus, the means of vacuum pumping has a differential pumping structure which consists of three or more vacuum chambers connected through an opening in series, and the vacuum chambers are connected by a rough pumping port and vacuum is controlled by a assigned valve for each chamber.

According to a sixteenth aspect of the invention, a charged particle beam apparatus comprises: an ion source; an ion illumination optics which focuses an ion beam emitted from the ion source on a sample and performs scanning; and means of vacuum pumping which evacuates the ion illumination optics, and in the apparatus, a surface of the sample is processed by irradiation with the ion beam. The means of vacuum pumping has a differential pumping structure with two or more vacuum chambers connected through an opening in series; a pump made of non-evaporable getter alloy is placed in an upstream vacuum chamber with a high degree of vacuum; and a gas absorbing surface of the non-evaporable getter alloy is fixed without contact with other parts.

According to the invention, it is possible to realize a compact charged particle beam apparatus with non-evaporable getter pumps which can maintain high degree of vacuum even during emission of an electron beam without generating foreign particles.

DETAILED DESCRIPTION OF THE PREFERRED EMBODIMENTS

Next, preferred embodiments of the present invention will be described in detail referring to the accompanying drawings.

First Embodiment

Figure 1:
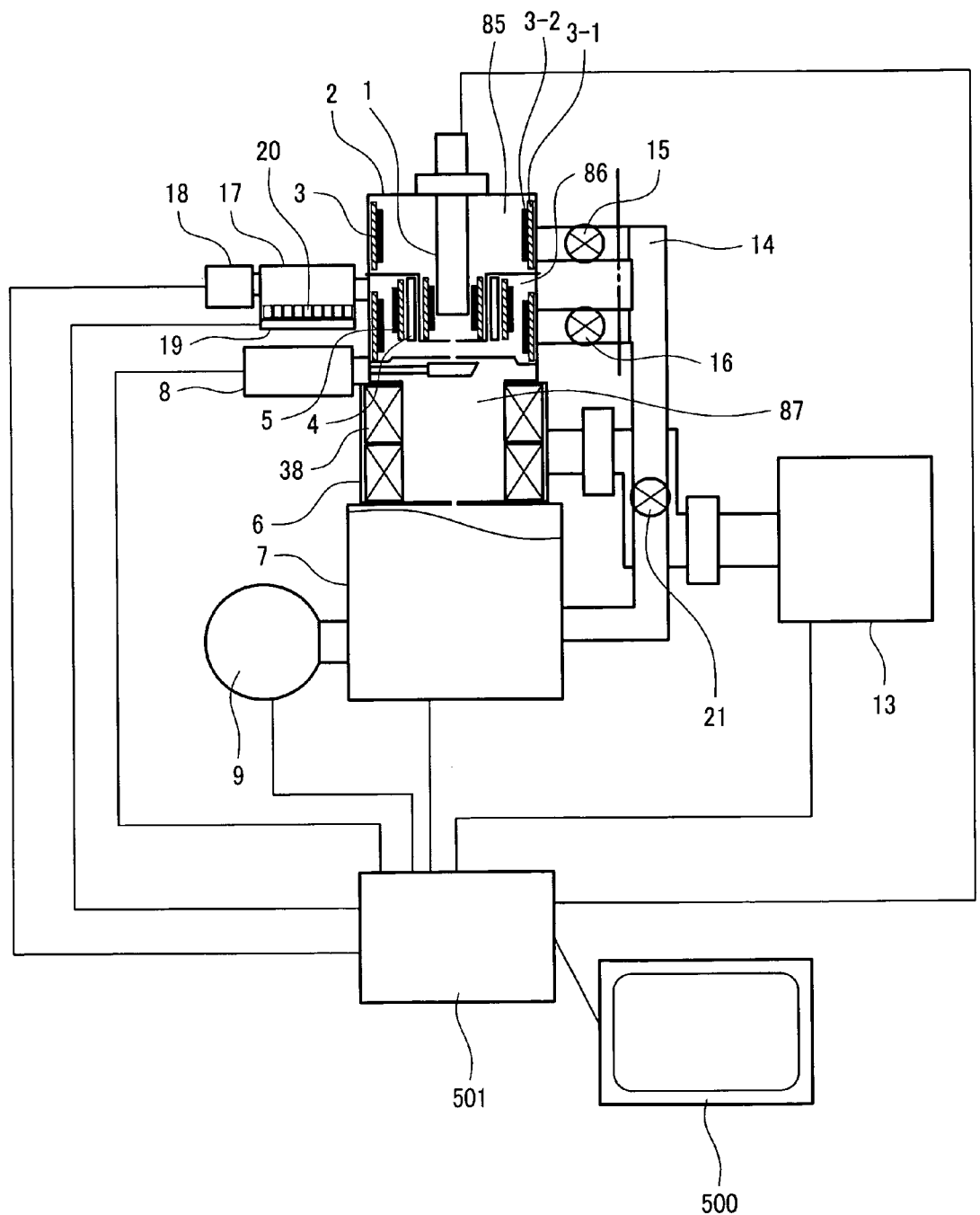
FIG. 1 illustrates the basic structure of a charged particle beam apparatus according to a first embodiment of the invention.

FIG. 1 shows the structure of a charged particle beam apparatus according to the first embodiment of the invention. This embodiment employs a thermal field emitter electron gun (TFE) as an electron source. This electron source 1 is fitted to a flange with a diameter of 152 mm and connected with a feedthrough to electrodes (suppressor, extractor, tip) (not shown). The electron source 1 is inserted and fixed in an electron gun column 2. The electron gun column 2 consists of a first vacuum chamber 85 and a second vacuum chamber 86 with an opening between them. This leads to a differential pumping effect of a non-evaporable getter pump which increases the achieved degree of vacuum of the first vacuum chamber 85 (decreases the pressure).

Another possible design for more compactness is that the first vacuum chamber 85 and the second vacuum chamber 86 are integrated into one vacuum chamber to omit part of the pipe including a valve 16 in a rough pumping port 14. The rough pumping port 14 in the charged particle beam apparatus according to the first embodiment can be detached along the two-dot chain line in FIG. 1, namely outside valves 15 and 16. For this reason, a part for vacuum seal such as a flange is provided in the portion corresponding to the two-dot chain line in FIG. 1.

The electron gun column 2 has a sheet non-evaporable getter pump 3 along its inner circumference. When heated, the non-evaporable getter pump 3 is activated to be able to absorb gas molecules. Therefore, a heater (not shown) is provided outside the electron gun column 2. In this embodiment, a sheath heater is wound around it. A non-evaporable getter pump 5 is wound around an electrode heater 4 which is used to bake the electrode before emission to prevent gas generation with electron beam emission. Since the non-evaporable getter pump 3 is in the form of a sheet, it can have larger surface area inside a small vacuum vessel 2 than a pump in the form of a block of several centimeters square and therefore a higher pumping speed and a longer lifetime are assured.

Figure 2:
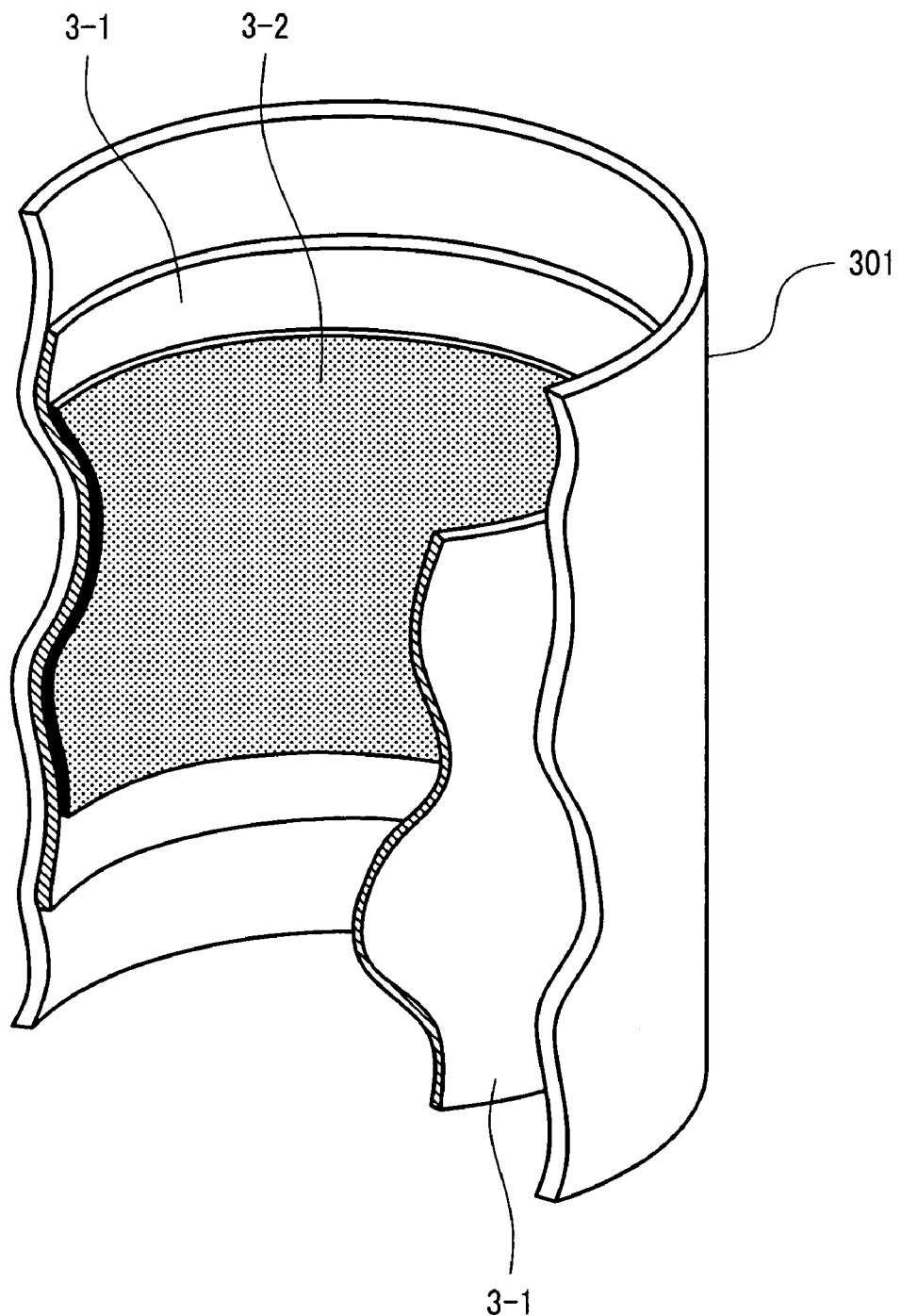
FIG. 2 illustrates an appearance of a non-evaporable getter pump in place according to the invention.

Moreover, as shown in FIG. 2, the non-evaporable getter pump 3 consists of a sheet 3-1 and non-evaporable getter alloy 3-2 where the non-evaporable getter alloy 3-2 is deposited on only one side of the sheet 3-1 and this side is on the vacuum side. This is desirable because the brittle non-evaporable getter alloy 3-2 is prevented from coming off due to avoiding contacting the inner wall of the column 301.

Figure 3:
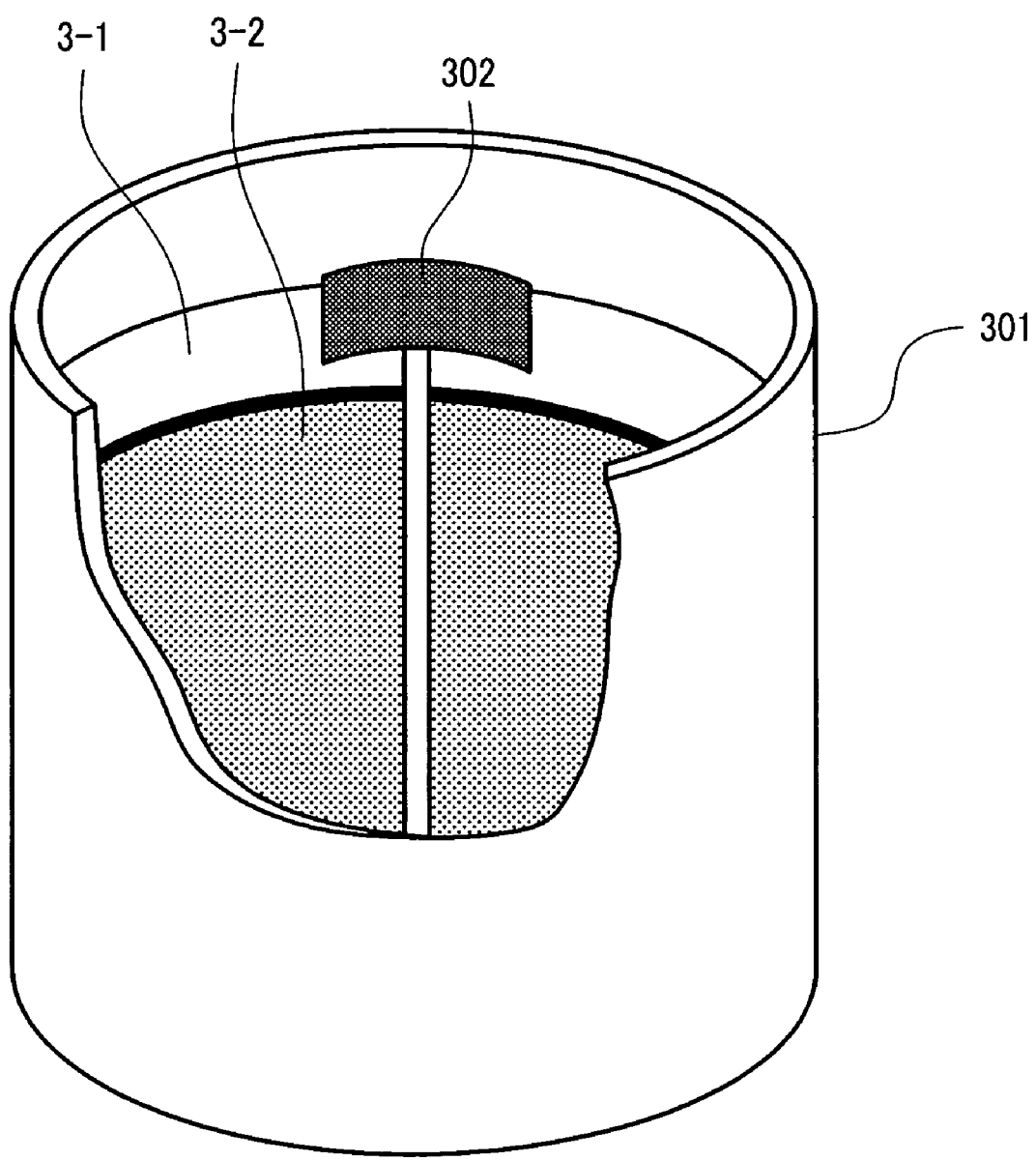
FIG. 3 illustrates a method of fixing a non-evaporable getter pump with means for fixation according to the invention.

In case that non-evaporable getter alloy should be deposited on both sides of the sheet; contact with the column is unavoidable. In order to decrease coming off, the non-evaporable getter alloy 3-2 deposited on a surface of the sheet 3-1 is partially stripped to expose part of the sheet surface to make an area free of non-evaporable getter alloy for a means of fixation 302, as shown in FIG. 3. This arrangement is desirable because generation of foreign particles cannot occur due to contact between sheets or contact of the means for fixation 302 with the non-evaporable getter alloy. Also, the means for fixation 302 fixes the non-evaporable getter 3 more securely.

Besides, not only generation of foreign particles can be prevented but also thermal conductivity can be increased, because the sheet 3-1 is in contact with the column 301 in this way and heated by a heater wound around the outside of the column 301.

Figure 4:
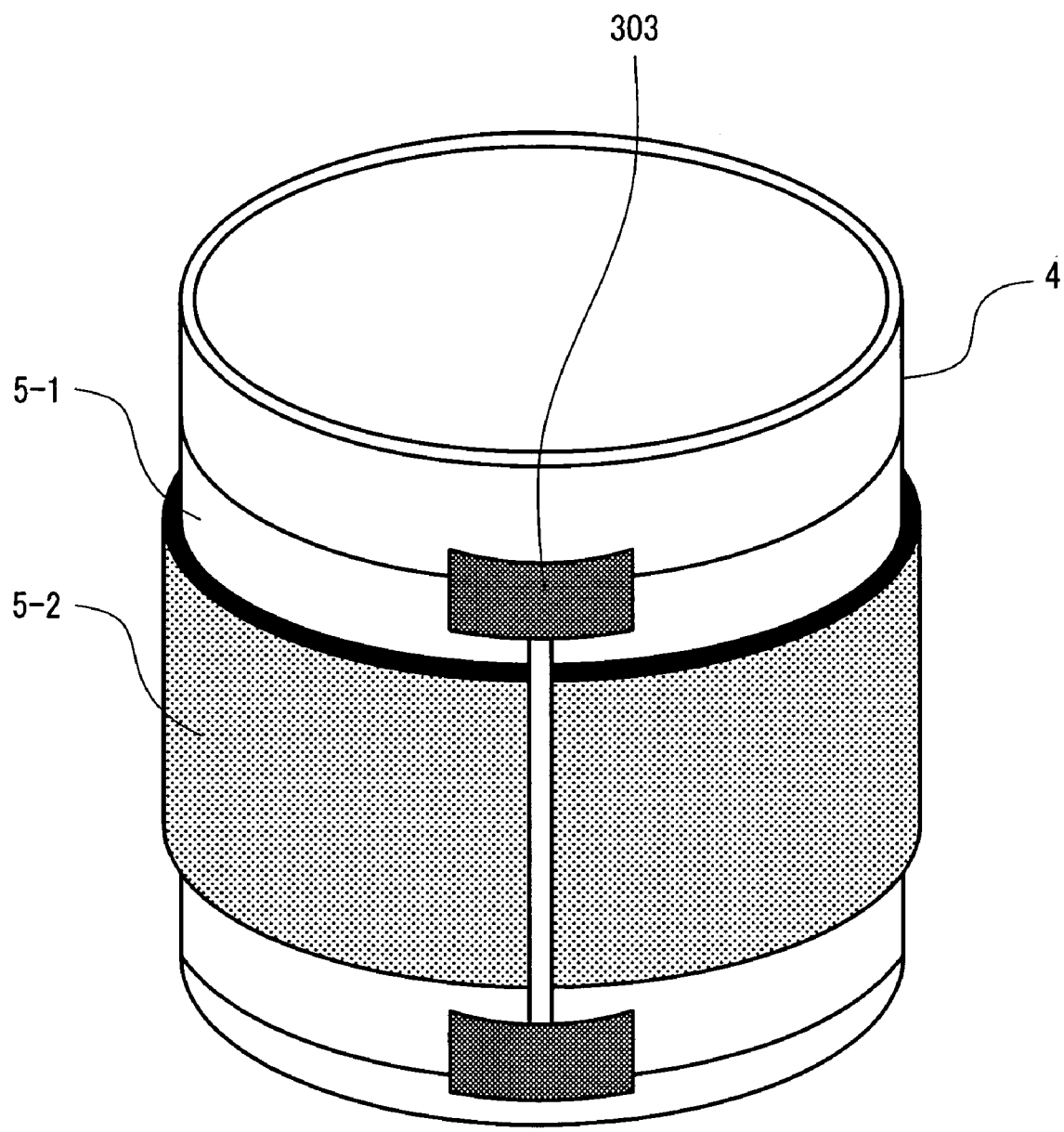
FIG. 4 illustrates another method of fixing a non-evaporable getter pump with means for fixation according to the invention.

If a sheet 5-1 is wound around a cylindrical heater 4 as shown in FIG. 4, the sheet should be in contact with the cylinder and non-evaporable getter alloy 5-2 should not be in contact with it. The means for fixing the sheet should be fitted to an exposed area of the sheet 5-1 as mentioned above to avoid contact with the non-evaporable getter alloy 5-2. An exposed area may be made by stripping part of the deposited non-evaporable getter alloy or using a mask during the deposition process to leave an alloy-free area in the deposited non-evaporable getter alloy in advance.

Although the sheet non-evaporable getter pump is used here, instead a non-evaporable getter material can be deposited on the heater surface too. This increases packaging density and reduces the risk of the material coming off. On the other hand, special care must be taken not to allow the non-evaporable getter alloy deposited on the heater surface to touch other components.

If there were loose foreign particles, an electric discharge due to shorting would be likely to occur because the non-evaporable getter material is an alloy and electrically conductive. Therefore, this arrangement seems particularly advantageous when an electron gun which includes a high voltage component is used.

Figure 12:
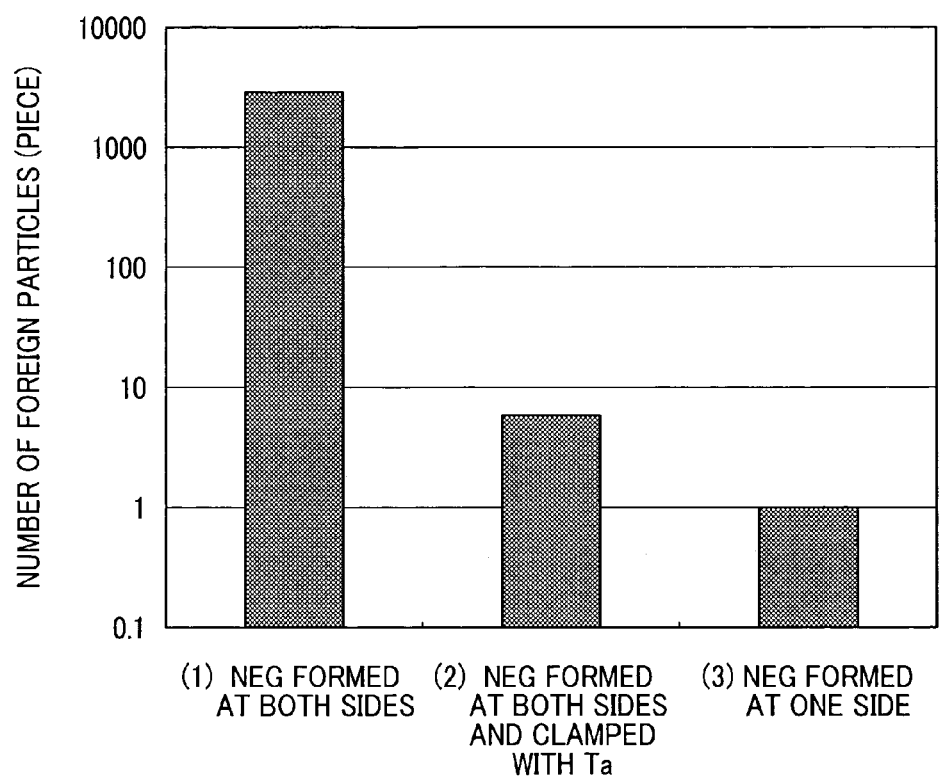
FIG. 12 shows the result of comparison of frequency of generation of foreign particles among three deposition types of sheet non-evaporable getter alloy, namely two types of double-side deposition and a one-side deposition.

FIG. 12 shows the result of a test on the frequency of generation of loose foreign particles. In this test, three samples were prepared: (1) a sample with non-evaporable getter (NEG) alloy film formed at both sides of the sheet, (2) a sample with non-evaporable getter alloy film formed at both sides of the sheet and a NEG-free area clamped by fixation means, and (3) a sample with non-evaporable getter alloy film formed at one side of the sheet placed in a vacuum vessel. The test method was as follows: the sheet was inserted along the inner wall of a vacuum vessel with an inside diameter of 37 mm, the vessel was fixed above a silicon wafer with no foreign matter, the vessel outer wall was hit with a hammer 20 times, then foreign particles which had fallen on the silicon wafer were counted. The test is considered an acceleration test on foreign particles. An optical microscope was used to count foreign particles. Foreign particles with a diameter of 5 microns or more were detected by visual inspection and recorded.

The test result indicates that the number of foreign particles is as many as over 3000 for the sample with non-evaporable getter alloy film formed at both sides. For the sample with non-evaporable getter alloy film formed at both sides and clamped by fixation means, the number is incomparably small or 6. This is probably because the fixation means decreases the frequency of contact between the vacuum vessel inner wall and the non-evaporable getter alloy during hitting and reduces the force of contact. For the sample with non-evaporable getter alloy film formed at one side, it was confirmed that the number of foreign particles is minimum or 1. If the sheet with non-evaporable getter alloy film formed at one side is clamped by fixation means, it is considered to generate less foreign particles due to disturbance.

In addition to the above type of non-evaporable getter pump, there is a porous type which is made by pulverized non-evaporable getter alloy into fine particles of 100 mesh or so and forming them into pellets of several centimeters square. Since this type has a large effective surface area, it is advantageous in that the pumping speed can be higher than the sheet type or deposition type but disadvantageous in that foreign particles are easily generated upon contact.

Figure 5:
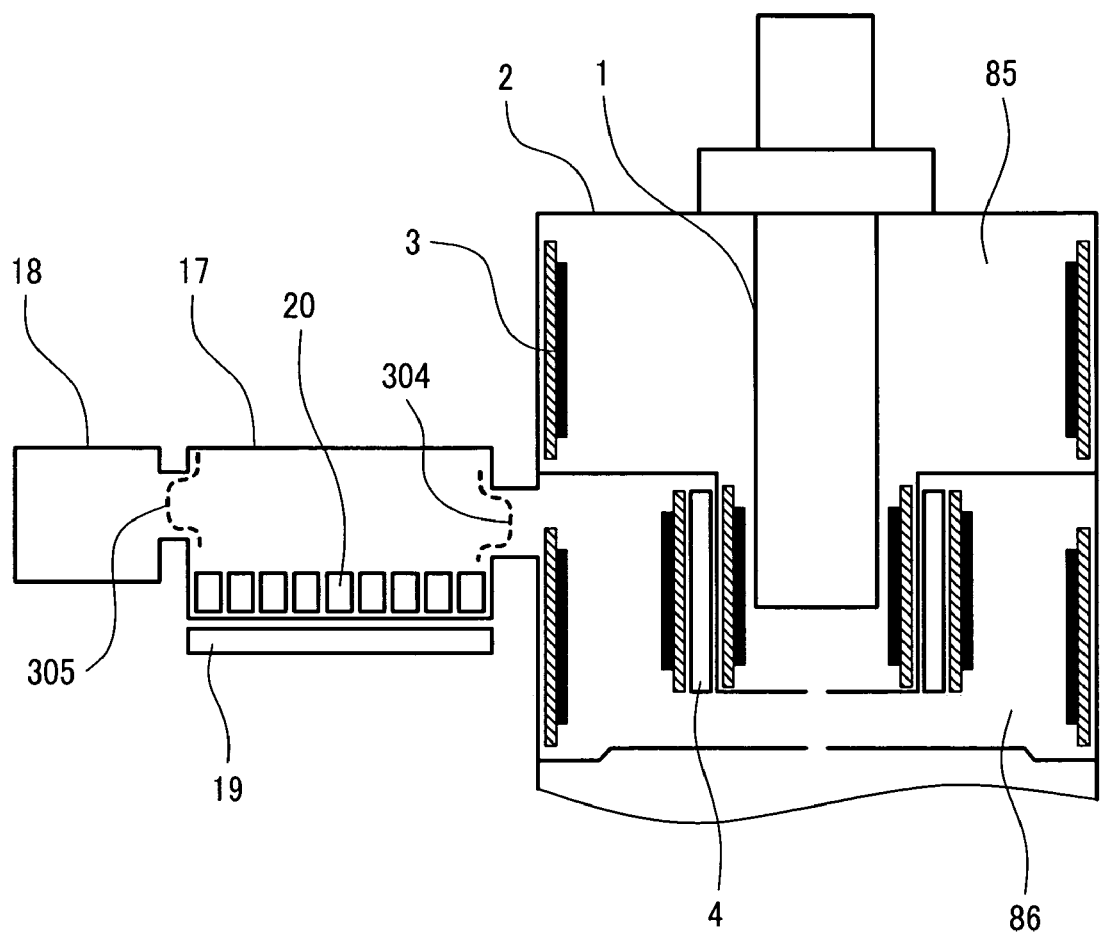
FIG. 5 illustrates a structure with an additional chamber according to the invention.

In this embodiment, as shown in FIG. 1, an additional chamber 17 is provided beside the electron gun column 2 and some pellets 20 are inserted therein. Beneath the additional chamber 17 is a heater 19 which is used to activate the non-evaporable getter pellets 20. It is desirable to provide a vacuum gauge 18 in the additional chamber 17 to check the achieved degree of vacuum. Also, as shown in FIG. 5, if the boundaries with the electron gun column 2 and the additional chamber 17 are partitioned by meshes 304 and 305, foreign particles are prevented from entering the electron gun column 2.

Figure 14:
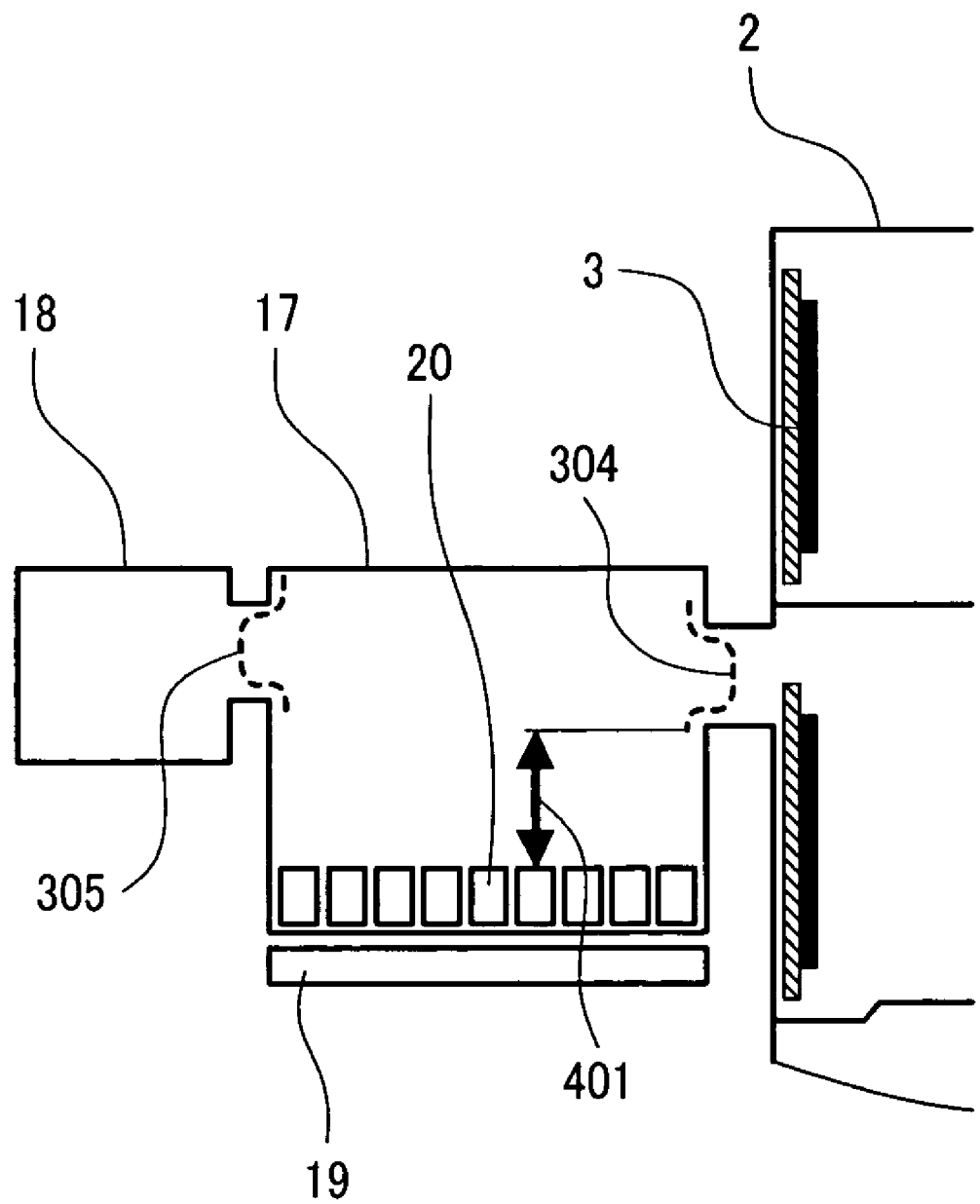
FIG. 14 illustrates another structure with an additional chamber according to the invention.

As shown in FIG. 14, when the pellets are placed in the additional chamber 17 downward from the opening for connection with the electron gun column 2 by a distance as indicated by arrow 401, loose particles of non-evaporable getter alloy hardly enter the column under the gravitational influence.

A thermocouple on the side face of the electron gun column 2 monitors the temperature of heating the non-evaporable getter pump 3. In this embodiment, the sheet non-evaporable getter pump 3 placed along the inner circumference of the electron gun column 2 is designed to be activated at 400° C. for ten minutes. The non-evaporable getter pump 5 around the electrode heater 4 is designed to be activated at 550-600° C. The reason for this is that when baking by the electrode heater takes place for about 8 hours as described later, it is important to prevent the non-evaporable getter pump 5 around the heater from being activated and absorbing a lot of gas, resulting in a shorter lifetime.

Since downstream of the electron gun column 2 there is an electro-optics column 6 which includes a coil 38 and electric wiring, usually the column temperature cannot be increased to more than 100° C. Hence, because of insufficient baking, it is estimated that a considerable amount of gas which the non-evaporable getter pump hardly removes is released from the wall surface on the vacuum side. Besides, inflow of rare gases such as argon gas from the sample chamber 7 with the lowest degree of vacuum might lower the degree of vacuum in the electron gun column 2. Since the atmosphere contains about 1% argon, particular attention must be paid to this point. Typically the sample chamber is evacuated by a turbomolecular pump 9 and the degree of vacuum in the chamber is about $10^{-3}$ Pa.

Figure 6:
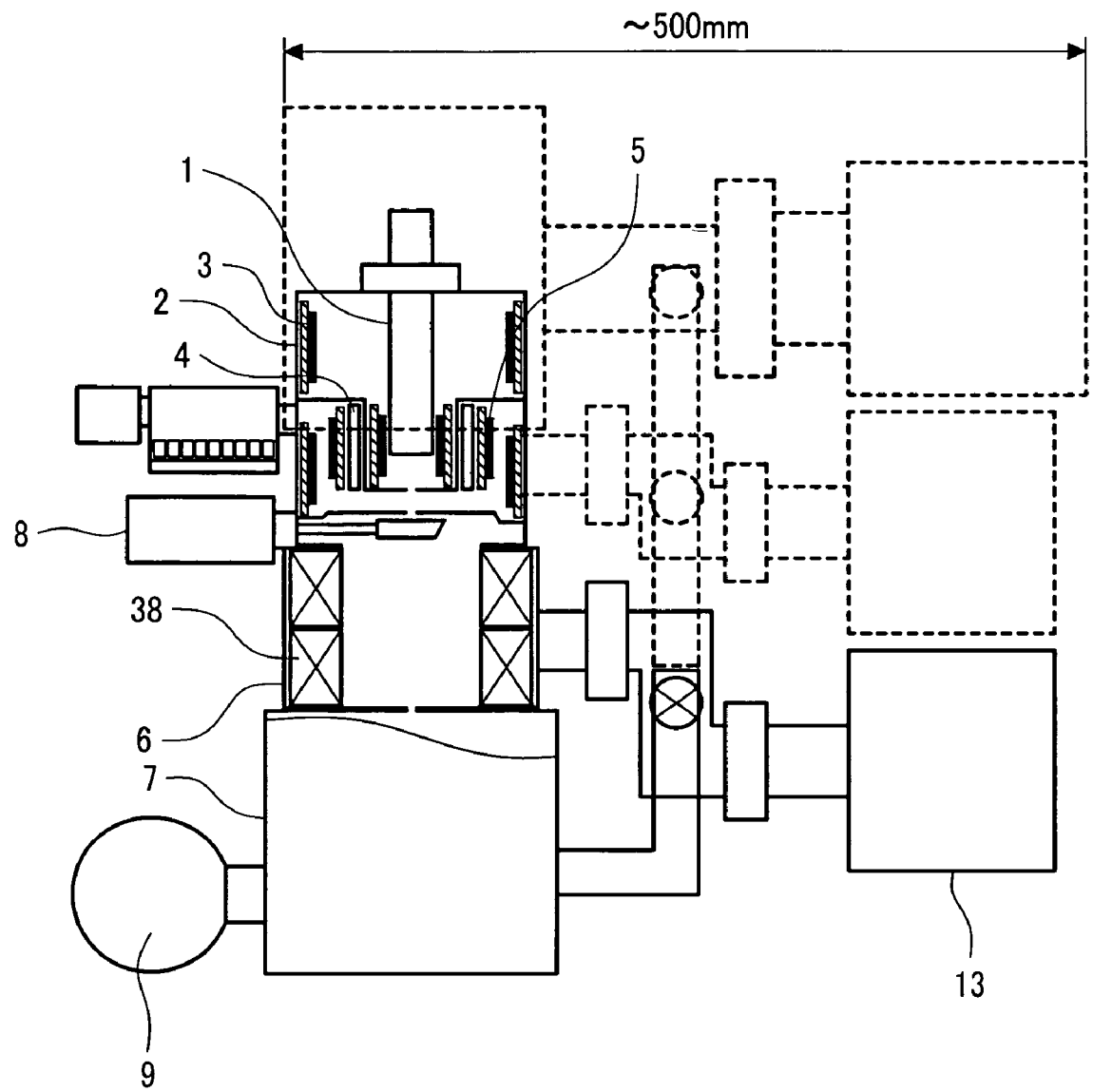
FIG. 6 compares the apparatus according to the invention with the conventional apparatus.
Figure 8:
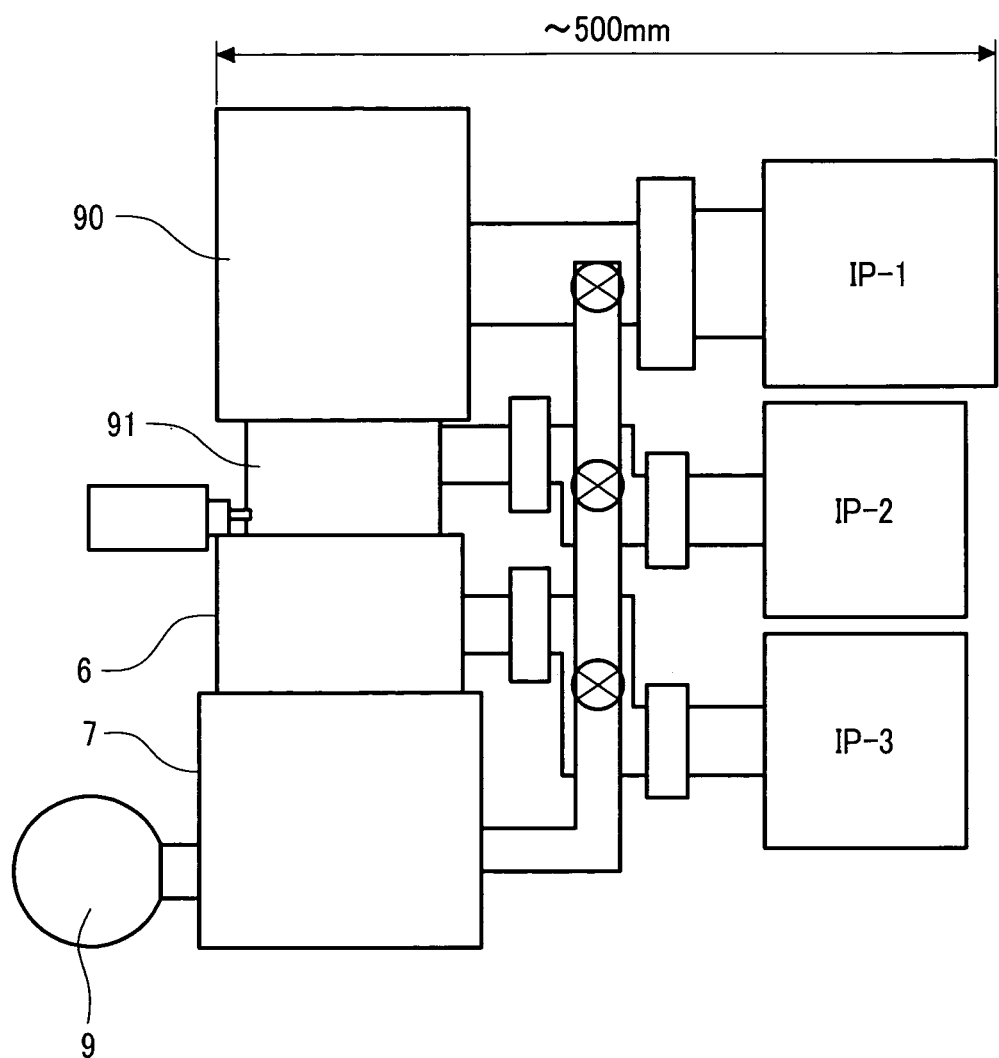
FIG. 8 illustrates the structure of the conventional electron microscope.

In order to solve this problem, the conventional apparatus as shown in FIG. 8 uses special ion pumps (IP-1, -2, -3) to evacuate the chambers separated through small-radius openings. As can be understood from FIG. 6, this embodiment (indicated by solid line) is remarkably different from the conventional apparatus (indicated by broken line). As shown in FIG. 8, the ion pumps (equivalent to IP-1, -2, and -3 in FIG. 8) are fixed somewhat away from the column in order to avoid the influence of a magnetic field from the getter pump, which also limits the possibility of size reduction.

Next, details of this embodiment will be described referring to FIG. 1. As mentioned above, since a high degree of vacuum cannot be maintained only by the non-evaporable getter pump 3, this embodiment combines it with an ion pump. This apparatus includes a series of three vacuum chambers: an electron gun chamber as the electron source 1 located most upstream (first vacuum chamber 85), an intermediate chamber (second vacuum chamber 86) connected with the chamber 85 through an opening, and the electro-optics column 6 (third vacuum chamber 87) connected with the chamber 86 thorough an opening. Further, the third vacuum chamber 87 is connected with the sample chamber 7 through an opening, constituting a differential pumping structure.

The upstream electron gun chamber and intermediate chamber incorporate non-evaporable getter pumps 3 and 5 respectively and the additional chamber 17, located beside the intermediate chamber, incorporates pellet type non-evaporable getter pumps 20 and the ion pump 13 is provided for the downstream electro-optics column 6 to evacuate it. The partial pressure of gas hardly evacuated by the non-evaporable getter pump is very low, so it has been demonstrated by an experiment that a single small ion pump with a pumping speed of 20 liters/second or less is enough to remove such gas. Especially it is more advantageous to use a sputter ion pump or noble ion pump since it removes rare gases efficiently at a lower pumping speed. As FIG. 6 suggests, space requirement can be remarkably reduced in comparison with the conventional apparatus with three ion pumps (indicated by dotted line), contributing to apparatus compactness. Another advantage is that when the weighty ion pump is located in as low a position as possible, the position of centroid is low and the vibration characteristic is substantially improved. The largest advantageous effect is that generation of foreign particles by the sheet non-evaporable getter pump is prevented and the pellet type non-evaporable getter pump 20 with a high pumping speed is operated without generating foreign particles.

Next, the process of attaining a prescribed vacuum condition according to this embodiment will be explained. After all components which are to face the vacuum in the electron gun column 2 are cleaned and dried, they are assembled. While the assembled electron gun column 2 is evacuated, it is attached to another apparatus in which the baking temperature is not limited to 100° C. or less unlike this embodiment and baking is performed at 300° C. for about 8 hours using the sheath heater (not shown) wound around the electron gun column 2 to degas the inside. Then, after breaking the vacuum of the chamber, the electron gun column 2 is removed and mounted on the electro-optics column 6 of the scanning electron microscope and vacuum pumping is started by the turbomolecular pump 9. The valves 15, 16 and 21 fitted to the rough pumping port 14 are opened to remove gas from the electron gun column 2 efficiently.

In this condition, the heater (not shown) wound around the outside of the electron gun column 2 is turned on to start baking. During baking, the temperature of the interface between the electron gun column 2 and the electro-optics column 6 is monitored and when the temperature reaches about 80° C., the heater is turned off. Baking is performed for about 10 hours under the above mentioned temperature control. After that, voltage is supplied to the electrode heater 4 to bake it and, at the same time, activate the non-evaporable getter pump 5 around it. Here, a target temperature of the heater 4 of about 550° C. is held for about one hour. To activate the pellet type non-evaporable getter pump 20 in the additional chamber 17, the heater 19 is turned on and maintained at 350° C. for one hour. After the temperature goes down to room temperature naturally, the valves 15, 16 and 21 fitted to the rough pumping port 14 are closed and the ion pump 13 is turned on for evacuation.

With the above procedure, vacuum pumping is performed without foreign particles from the non-evaporable getter pump and the achieved degree of vacuum in the electron gun column 2 becomes $10^{-8}$ Pa. It has been confirmed that even when in this condition a gun valve 8 driven by an air cylinder is opened to open the sample chamber through the opening, the degree of vacuum in the electron gun column 2 is maintained at the level of $10^{-8}$ Pa. The degree of vacuum of the ion pump 13 is about $5 \times 10^{-6}$ Pa. It can be said from this that as a result of differential pumping, the achieved degree of vacuum is higher as the chamber lies more upstream.

Next, control means of the apparatus according to this embodiment will be described. The various components of the apparatus including the turbo-molecular pump 9, ion pump 13, electron source 1, gun valve 8, electron optics 38, vacuum gauge 18 and heater 19 are connected with the control means 501 so that the control means 501 can receive and transmit operation and detection signals and a processor in the control means 501 performs sequence control. A display 500 is used for user interfacing and display of an SEM image.

It has been confirmed that through the control means, 2 kV is supplied to the electron source to let it emit electrons and the electron gun emits an electron beam without any abnormal discharge and any substantial change in the degree of vacuum while keeping the degree of vacuum in the electron gun column 2 at the level of $10^{-8}$ Pa.

In addition, although the non-evaporable getter pump tends to decrease its pumping speed as it absorbs more gas, a high degree of vacuum can be achieved continuously for as long as 3-4 years thanks to: (1) adoption of the differential pumping structure, (2) combination with the sputter ion pump, and (3) increased pumping speed by the use of the sheet non-evaporable getter pump and pellet type non-evaporable getter pump.

Although this embodiment adopts an ion pump as a pump combined with the non-evaporable getter pump, a turbo-molecular pump may be used instead of an ion pump. However, in the case of a turbo-molecular pump, since its blade, which turns for vacuum pumping, is structurally destined to vibrate during turning, if it is located-near the electron gun, the SEM image may vibrate. Hence, it is more desirable to use an ion pump or a vacuum pumping device which vibrates less, as the pump combined with the non-evaporable getter pump.

So far the first embodiment as exemplified by a charged particle beam apparatus using electron beams, particularly a scanning electron microscope, has been described. However, obviously the invention can be applied to many types of charged particle beam apparatus such as transmission electron microscopes, electron beam writing systems and focused ion beam systems using ion particles.

Second Embodiment

While the first embodiment concerns an apparatus which uses an auxiliary pump, the second embodiment concerns an apparatus in which a column does not requires any type of auxiliary pump such as an ion pump or turbo-molecular pump.

Figure 7:
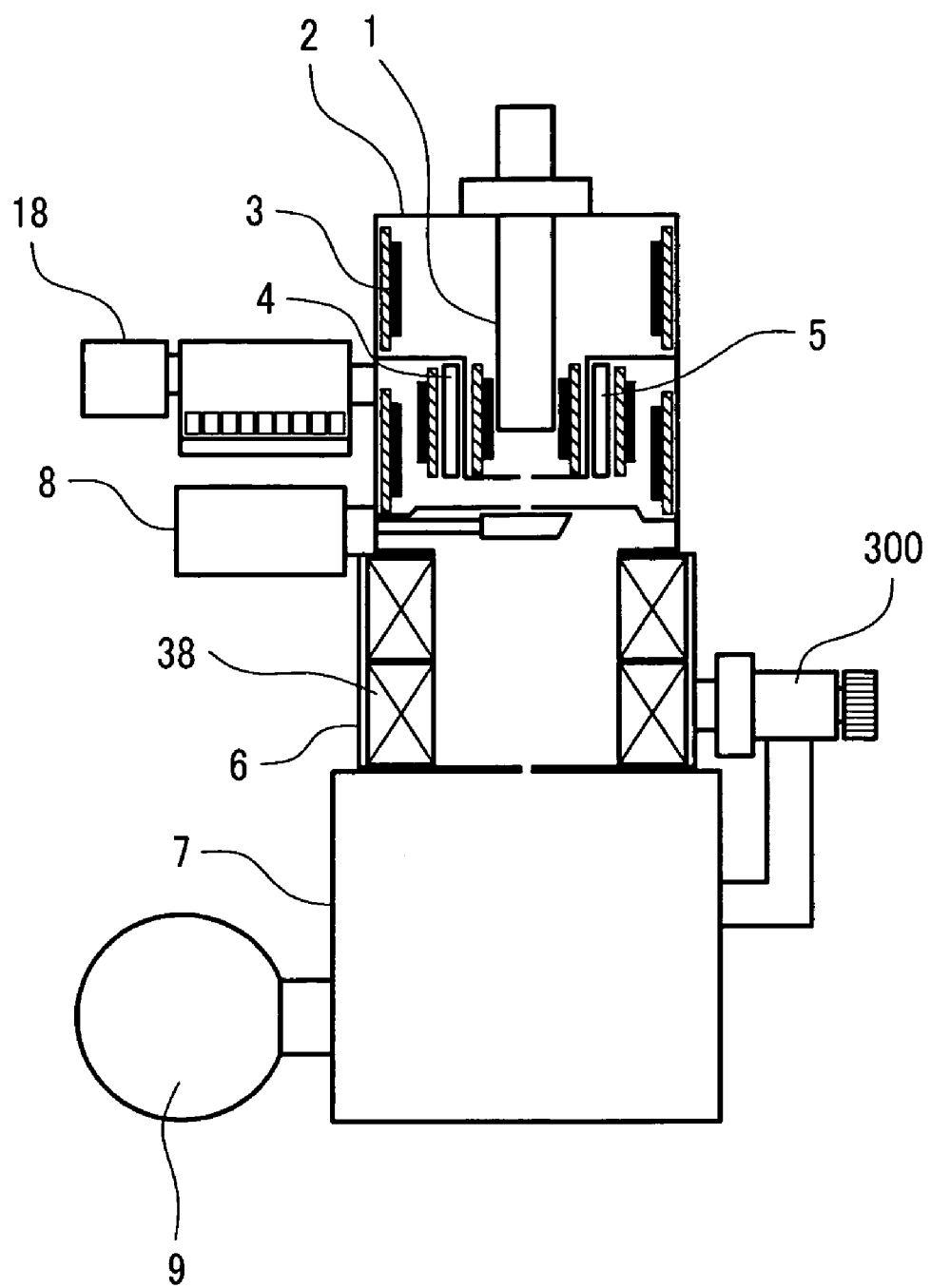
FIG. 7 illustrates the basic structure of a charged particle beam apparatus according to a second embodiment of the invention.

Referring to FIG. 7, the basic structure of the apparatus is almost the same as the first embodiment except the following points. First, in the second embodiment, the ion pump 13 for the electro-optics column 6 is eliminated and instead a valve 300 is connected with the sample chamber 7.

Carbon contaminants on parts with low heat resistance which cannot withstand the baking temperature of 200° C. or so are cleaned in advance. It is particularly important to remove all oily residues on machined surfaces of metallic parts. This reduces generation of hydrocarbon gases which a non-evaporable getter pump hardly removes.

Although generation of hydrocarbon gases is reduced, all such gases are not removed. Therefore, the second difference from the first embodiment is to use the evacuation function of the turbo-molecular pump 9 which evacuates the sample chamber 7 connected with the valve 300. Since the turbo-molecular pump mechanically absorbs gas molecules, it can remove rare gases such as hydrocarbon and argon. The conductance can be controlled by adjusting the opening degree of the valve 300; while monitoring the vacuum gauge 18, the opening degree of the valve 300 should be adjusted and when the most desirable degree of vacuum is attained, the valve position should be fixed.

The other structural parts and the control method and means may be almost the same as in the first embodiment. However, it should be noted here that there is no longer information on vacuum which would be obtained from the ion pump. To compensate for lack of such information, a signal from the vacuum gauge 18 in the additional chamber 17 may be used or a vacuum gauge (not shown in FIG. 7) may be newly installed for the electro-optics column 6.

As detailed so far, according to the present invention, it is possible to realize a compact charged particle beam apparatus, such as a scanning electron microscope, focused ion beam system or charged particle beam apparatus with a plurality of columns, in which the degree of vacuum in the column including the electron source is maintained at the level of $10^{-8}$ Pa with less generation of foreign particles.

Third Embodiment

This embodiment concerns non-evaporable getter alloy in a form other than a sheet or pellet. Specifically, the getter alloy size should be on the millimeter order (less than 10 mm) and typically, grained non-evaporable getter alloy of approx. 3 mm square is easy to handle. The alloy is a bulk alloy of the above size and generates no foreign particles upon contact. However, since the effective surface area of the bulk alloy is smaller, the pumping speed tends to be lower.

By contrast, the pellet type is porous because it is made by sintering fine particles of several microns to several hundreds of microns and therefore in case of the pellet type, the surface area is larger but fine particles easily come off upon contact.

In order to increase the surface area of grained non-evaporable getter alloy, its surface should have a convexo-concave shape. The surface of the grained non-evaporable getter alloy used in this embodiment has a convexo-concave pattern which is repeated in cycles of several microns to several dozen microns.

As a result of comparison in pumping speed between the grained non-evaporable getter pump and the pellet type one, it has been found that under the same test conditions, the pumping speed of the pellet is 3 or 4 times higher and the pumping speed difference between them may be considered to be not so significant. In other words, since the grained getter alloy generates less foreign particles upon contact, it is suitable to be located in the vicinity of the electron source. An embodiment as a scanning electron microscope which uses such grained non-evaporable getter alloy will be detailed below.

Figure 9:
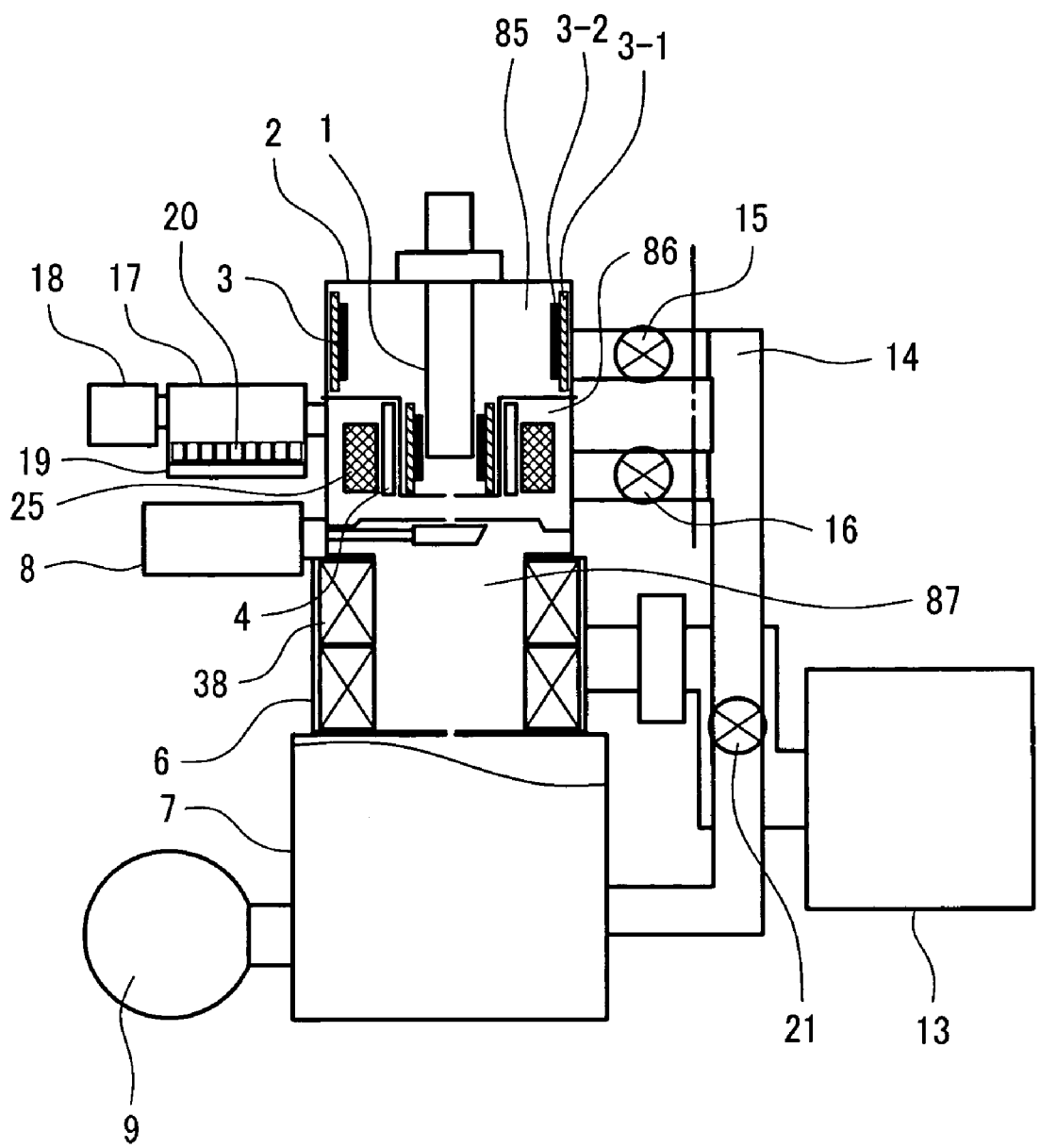
FIG. 9 illustrates the basic structure of a charged particle beam apparatus according to a third embodiment of the invention.

FIG. 9 illustrates the basic structure of the scanning electron microscope according to this embodiment. Like the first embodiment, this embodiment employs a thermal field emitter electron gun (TFE) as an electron source. This electron source 1 is fitted to a flange with a diameter of 152 mm and connected with a feed through to an electrode (suppressor, extractor, tip) (not shown). The electron source 1 is inserted and fixed in an electron gun column 2. The electron gun column 2 consists of a first vacuum chamber 85 and a second vacuum chamber 86 with an opening between them. This leads to a differential pumping effect of a non-evaporable getter pump which increases the achieved degree of vacuum of the first vacuum chamber 85 (decreases the pressure).

The primary characteristic of this embodiment is to provide a pump 25 in which grained non-evaporable getter alloys is held by metal mesh in the second vacuum chamber 86. In this arrangement, contact between the alloys and the mesh is unavoidable. Therefore, generation of foreign particles upon contact between the mesh and the grained non-evaporable getter alloy was examined by a test. The mesh used in the test is made of stainless steel and its open-area-ratio is 70-80%.

The test was conducted as follows: five particles (grains) of alloy are placed on the mesh and the mesh is reciprocated horizontally over a silicon wafer five times; then fallen foreign particles on the wafer are counted. For the purpose of comparison, pellet alloy was tested similarly. Since actually the alloy is just held and there is virtually no relative movement, this may be an acceleration test under severe conditions.

Figure 11:
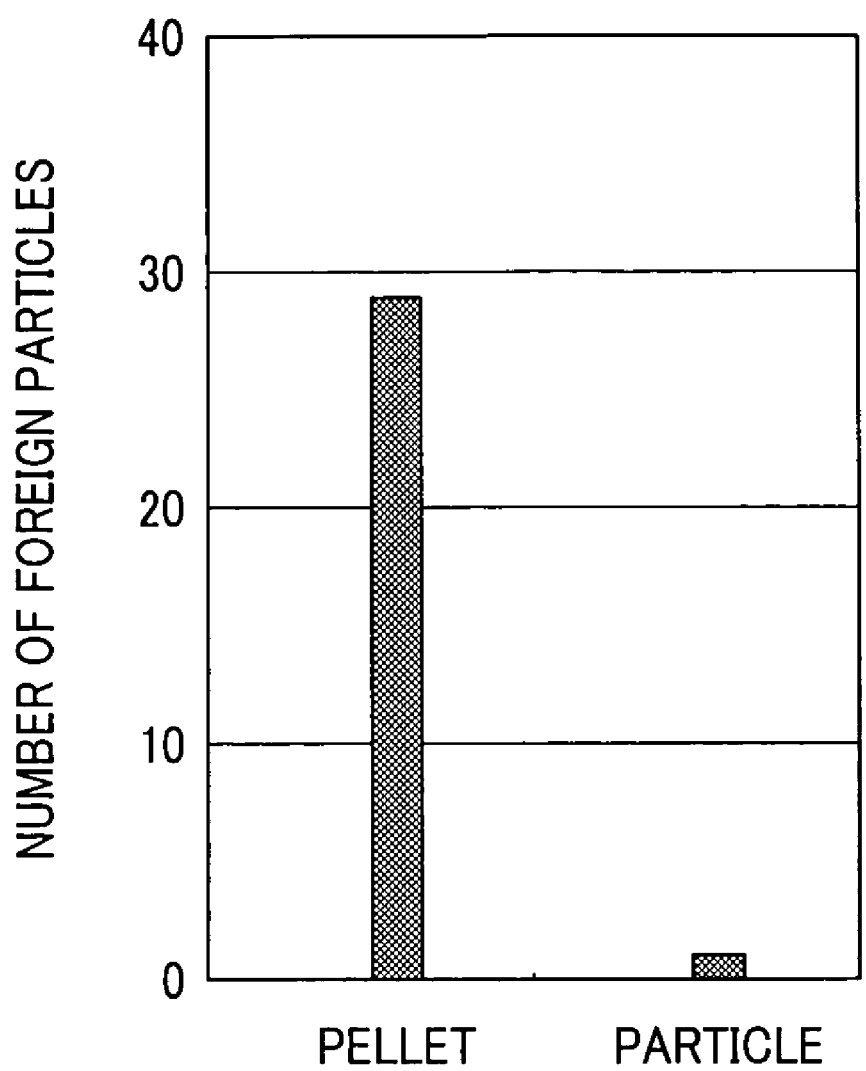
FIG. 11 shows the result of comparison of frequency of generation of foreign particles between grained non-evaporable getter alloy and pellet non-evaporable getter alloy.

The test result is shown in FIG. 11. It has been found that 29 foreign particles came from the pellet and only one particle from the grained alloy. This result reveals that the number of foreign particles from the grained alloy is incomparably small.

The use of grained alloy makes it possible that the non-evaporable getter pump is located in the immediate vicinity of the electron gun without generation of foreign particles. Consequently a high degree of vacuum can be maintained in the area around the electron source which requires the highest level of vacuum.

Figure 10:
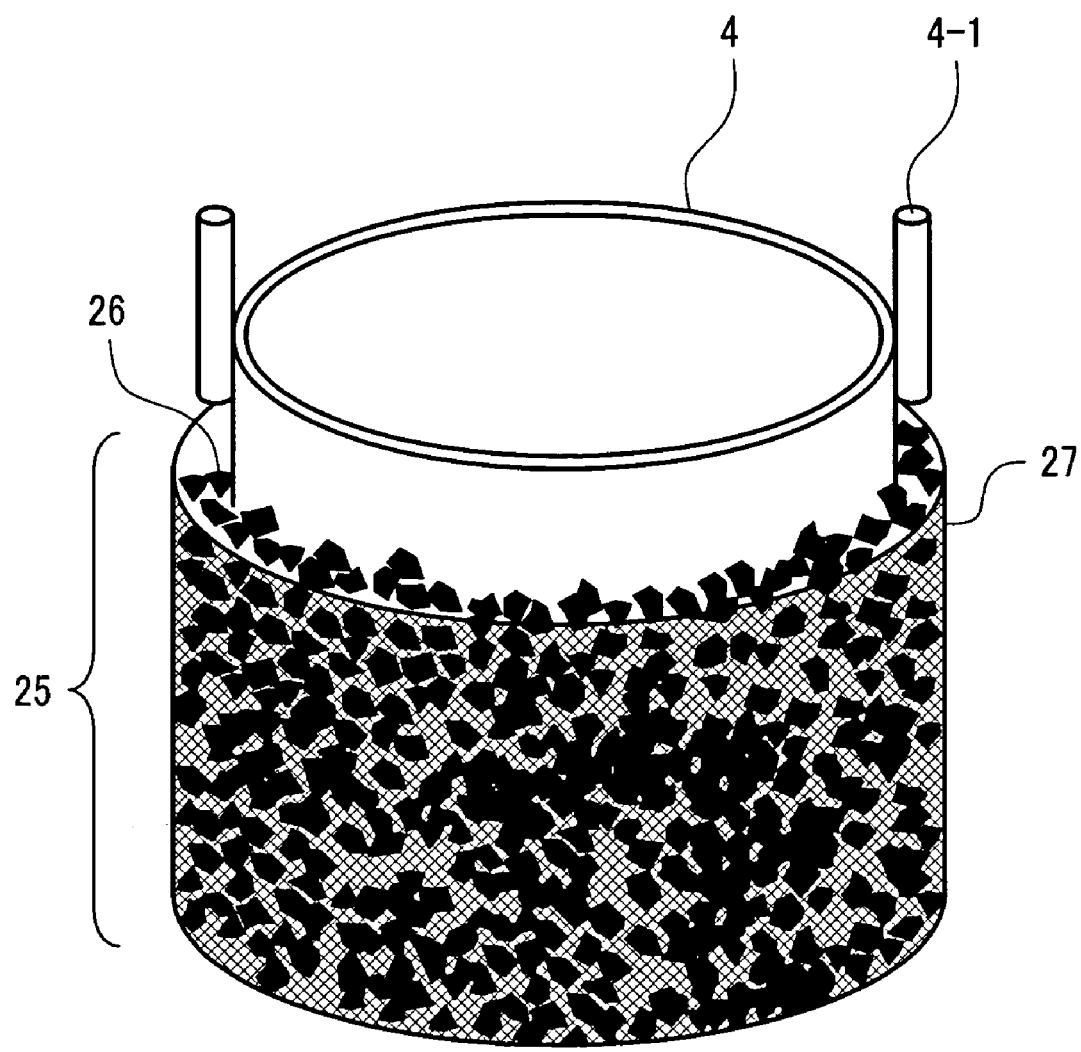
FIG. 10 illustrates means of placing grained non-evaporable getter alloy according to the invention.

Next, a concrete structure which uses grained non-evaporable getter alloy will be detailed. FIG. 10 shows the vacuum pump 25 which holds grained non-evaporable getter alloy 26. The grained non-evaporable getter alloy 26 used here has a total weight of 75 grams and is housed in the space surrounded by the outer wall of an anode electrode heater (ceramic heater in this case) 4 and a stainless steel mesh (open-area-ratio 70%) 27. This structure is efficient in the sense that the grained non-evaporable getter alloy can be easily heated in the vacuum and baking of the anode electrode can be done simultaneously.

Although the getter alloy is placed outside the heater in this embodiment, it may be placed inside the cylindrical heater or both inside and outside the heater. In the figure, 4-1 denotes an electrode which supplies electricity to the heater 4.

As described above, the pump 25 which uses grained non-evaporable getter alloy is placed in the second vacuum chamber 86 in the scanning electron microscope as shown in FIG. 9; however, the present invention is not limited thereto. Needless to say it may be placed in any other vacuum chamber including the most upstream vacuum chamber. For example, if it is located in the immediate vicinity of the electron source which requires the highest level of vacuum, vacuum pumping without generation of foreign particles is possible. As a result of a test in which actual vacuum pumping was done using a non-evaporable getter pump, a superhigh degree of vacuum, $5.0 \times 10^{-8}$ Pa, was achieved for the electron source.

Fourth Embodiment

Figure 13:
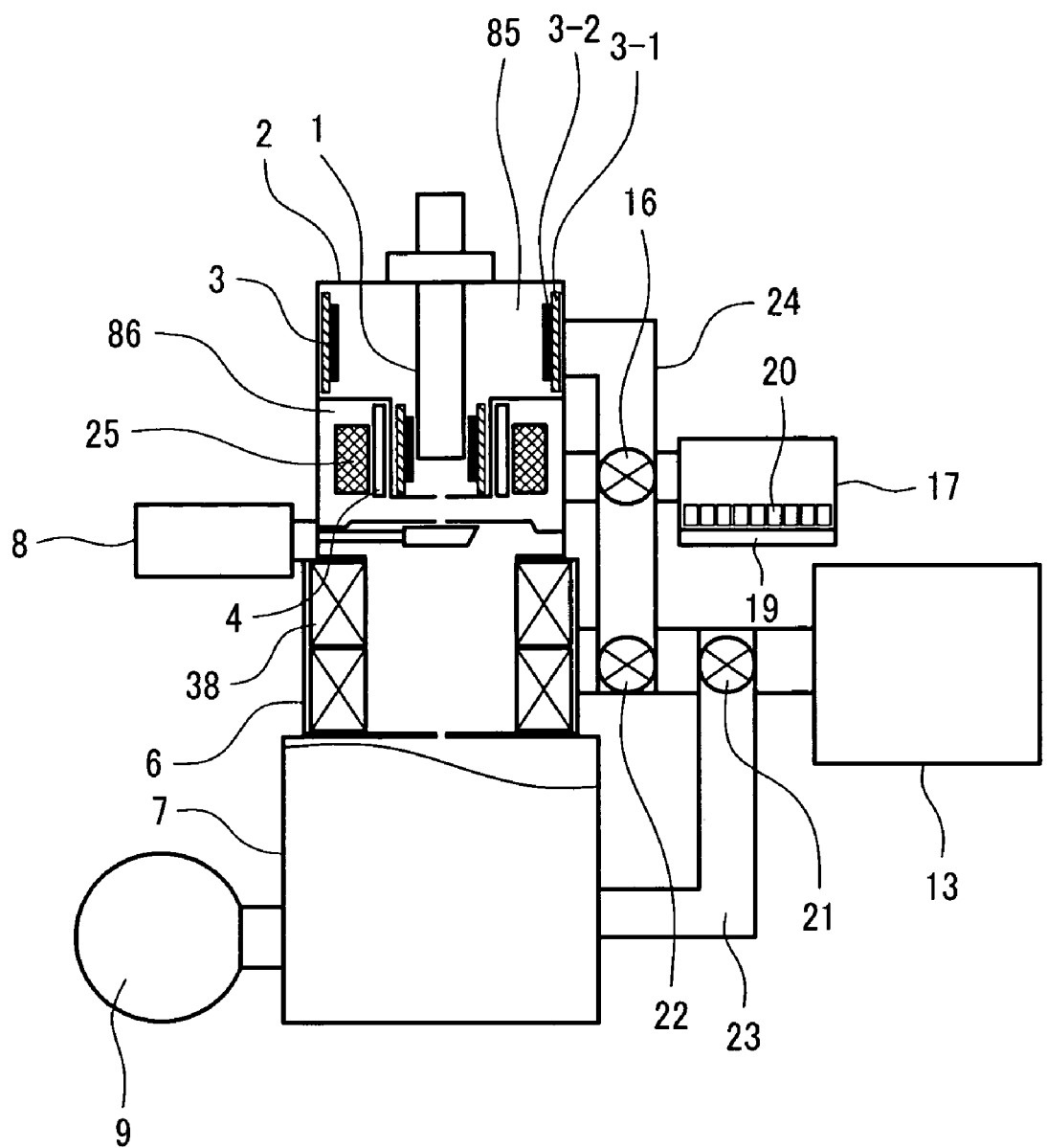
FIG. 13 illustrates the basic structure of a charged particle beam apparatus according to a fourth embodiment of the invention.

The fourth embodiment does not include a vacuum gauge like the vacuum gauge 18 for the auxiliary pump in the additional chamber 17 which the first embodiment includes. The absence of such a vacuum gauge reduces the apparatus cost. Next, the fourth embodiment will be detailed referring to FIG. 13.

The basic structure is the same as that of the first embodiment. This embodiment employs a thermal field emitter electron gun (TFE) as an electron source. This electron source 1 is fitted to a flange with a diameter of 152 mm and connected with a feedthrough to an electrodes (suppressor, extractor, tip) (not shown). The electron source 1 is inserted and fixed in an electron gun column 2. The electron gun column 2 consists of a first vacuum chamber 85 and a second vacuum chamber 86 with an opening between them. This leads to a differential pumping effect of a non-evaporable getter pump which increases the achieved degree of vacuum of the first vacuum chamber 85 (decreases the pressure).

The electron gun column 2 has a sheet non-evaporable getter pump 3 along its inner circumference. When heated, the non-evaporable getter pump 3 is activated to absorb gas. Therefore, a heater (not shown) is provided outside the electron gun column 2. In this embodiment, a sheath heater is wound around it. Also a non-evaporable getter pump is wound in the first vacuum chamber 85 facing the inner circumference of an electrode heater 4. Since the non-evaporable getter pump 3 is in the form of a sheet, it can have a larger surface area inside a small vacuum vessel 2 than a pump in the form of a block of several centimeters square and therefore a higher pumping speed and a longer lifetime are assured.

In this embodiment, pellet non-evaporable getter alloy 20 is placed in the additional chamber 17 connected with the second vacuum chamber 86 and a heater 19 is attached to the outside (atmosphere side) of the additional chamber. The difference from the first embodiment is absence of a vacuum gauge which is intended to check the degree of vacuum achieved by the non-evaporable getter pump in the additional chamber 17. In this embodiment, the same function is provided without a vacuum gauge.

The first vacuum chamber 85 and the electro-optics column 6 located downstream of the second vacuum chamber 86 are connected through a rough pumping port 24 and the chambers can be connected or disconnected through corresponding valves 16 and 22. The vacuum chamber and sample chamber 7 which are on the downstream are connected through a rough pumping port 23. The electro-optics column 6 is evacuated by an ion pump 13.

Regarding the ion pump 13, the output current value depends on the degree of vacuum and thus the degree of vacuum can be measured without an additional vacuum gauge. The pumping effect on the upstream can be checked taking advantage of this feature. The procedure is as follows.

First, gas is roughly pumped out of the whole apparatus until the degree of vacuum in the sample chamber 7 reaches about $1 \times 10^{-3}$ Pa. The degree of vacuum in the sample chamber 7 is measured using a vacuum gauge (not shown). During this process, the valves 16, 21 and 22 remain open. By doing so, the whole column is efficiently evacuated. After rough pumping is finished, baking of the ion pump 13, rough pumping ports 23, 24, additional chamber 17 and electron gun chamber 3 is done preferably at 200° C. for about 10 hours to reduce gas from the inner wall surface. Then, the ion pump 13 is turned on to start vacuum pumping and the degree of vacuum is recorded on a chart sheet. Then, the non-evaporable getter alloy 3 is heated and activated. A sheath heater (not shown) is used to activate it. At the same time, the ceramic heater 4 is turned on to activate grained non-evaporable getter alloy 26 (FIG. 10). In this embodiment, 400° C. is maintained for one hour for activation.

Next, the degree of vacuum of the ion pump 13 in this condition is measured. Let's take the degree of vacuum measured here as A. Then, the valve 21 is closed. At this time, it is necessary to confirm that the degree of vacuum of the ion pump increases. Let's take this degree of vacuum as B. Then, the valve 16 is closed and it should be confirmed that the degree of vacuum decreases. This confirmation is made to make sure that the non-evaporable getter alloy in the electron gun chamber 3 is active and performs vacuum pumping. Let's take this degree of vacuum as C. Then, the valve 22 is closed and it should be confirmed that the degree of vacuum decreases. Let's take this degree of vacuum as D. Lastly, whether the relation B>C>D>A exists or not is checked. If so, the air tightness of the chambers constituting the differential pumping system, operation of the ion pump, activation of the non-evaporable getter alloy are normal, which means that the system works normally without a vacuum gauge in the additional chamber 17. Needless to say, there is no problem with the provision of a vacuum gauge in the additional chamber 17.

Fifth Embodiment

Figure 15:
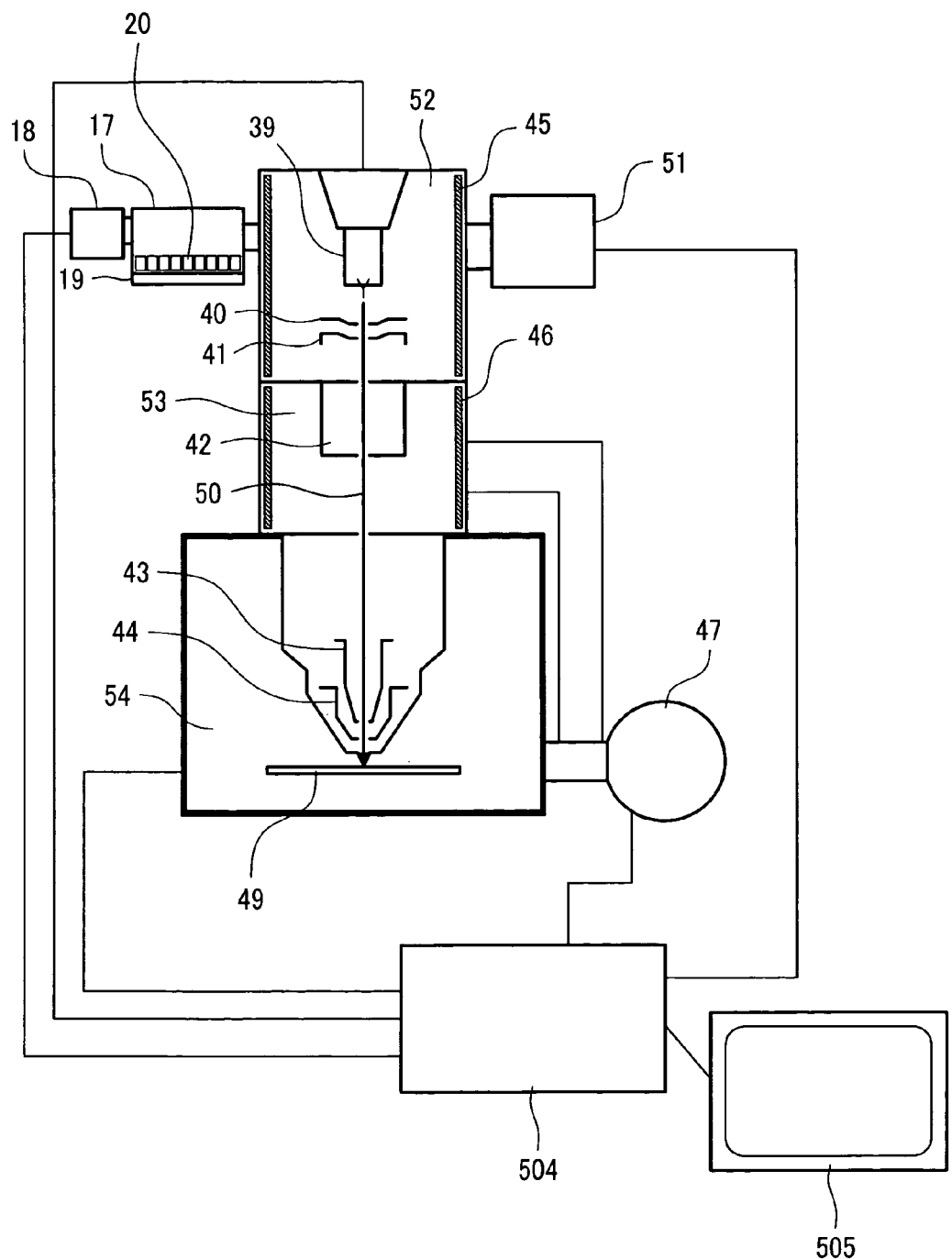
FIG. 15 illustrates the basic structure of a charged particle beam apparatus according to a fifth embodiment of the invention.

Referring to FIG. 15, a focused ion beam (FIB) system according to an embodiment of the present invention will be described below. The FIB system is a system which focuses ion particles heavier than electrons on a sample 49 to process the sample surface or detects electrons emitted from an area irradiated with an ion beam in the same manner as the SEM to create an image to be observed.

The conventional FIB system uses two or more ion pumps. As shown in FIG. 15, if the present invention is applied, the FIB column in the system and its surroundings can be smaller, as in the first embodiment.

The optics which focuses an ion beam 50 is a static electron optics consisting of a plurality of electrodes 40, 41, 42, 43 and 44 and does not have an electromagnetic lens which uses a coil, as seen in the SEM. Therefore, the heat resistance is higher than in the SEM and the FIB system can introduce non-evaporable getter pumps 45 and 46 more easily.

The ion source 39 in the FIB system must be located most upstream and the degree of vacuum must be maintained at the level of $10^{-7}$ Pa or so. For this reason, the system adopts a differential pumping structure like the SEM according to the first embodiment. The system shown in FIG. 15 has a two-step differential pumping structure. A sample chamber 54 and a vacuum chamber 53 located upstream of it are evacuated by a turbo-molecular pump 47.

A non-evaporable getter pump 45 in an ion source chamber 52 is in the form of a sheet and obviously means to avoid contact with the non-evaporable getter alloy as used in the first embodiment is also useful in this embodiment in order to prevent generation of foreign particles.

As mentioned above, since an ion beam is focused by the static electron optics, a non-evaporable getter pump 46 may also be placed in the vacuum chamber 53. Hence, the pumping speed can be increased.

Furthermore, as shown in FIG. 15, an additional chamber 17 is provided as means to evacuate the ion source chamber 52 with pellets non-evaporable getter alloy 20 and thus a high vacuum is maintained at high pumping speed without generation of foreign particles, as in the first embodiment. The structure and operation of the evacuation pump in the additional chamber are the same as in the first embodiment. It is desirable to provide an ion pump 51 for vacuum pumping of the ion source chamber 52 because it removes rare gases which a non-evaporable getter pump hardly removes and methane. By using measurement data on the degree of vacuum of the ion pump 51, the vacuum gauge 18 in the additional chamber 17 may be eliminated, which is desirable from the viewpoint of apparatus cost reduction.

The above components are connected with control means 504 through signal lines so that the control means 504 can receive and transmit control signals and image data and control operation sequences for the whole apparatus. A display 505 can be used for user interfacing and display of an image.

The other structural components are the same as in the conventional FIB system and detailed description thereof is omitted here. This embodiment is also applicable to a system which does not use an electron beam.

Sixth Embodiment

A microsampling apparatus according to the sixth embodiment of the invention will be described below, referring to FIG. 16.

A microsampling apparatus is designed for inspection and analysis of semiconductor devices, etc. whereby part of a semiconductor device is cut and its cross section is observed and analyzed. The apparatus has an FIB column 77 for cutting a sample and an SEM column 78 for observing the cutting position and cut cross section simultaneously where the two columns are angled to each other. The columns are also inclined by a given angle to an axis 81 vertical to the surface of a sample 60 placed in a horizontal plane. Hence the two columns are inclined adjacently to each other. This structure has a problem that a plurality of ion pumps which are conventionally attached to each column may interfere with each other or because of the weight of the ion pumps, the position of centroid is high and the columns easily vibrate.

In the microsampling apparatus according to this embodiment, the FIB and SEM columns each use only one ion pump. Therefore, the overall weight of the apparatus is far lighter than that of the conventional apparatus in which each column uses two or three ion pumps. In addition, if the ion pump is a sputter ion pump or noble ion pump, the efficiency in removal of rare gases which a non-evaporable getter pump hardly removes is improved, contributing to further size reduction. In this embodiment, the FIB column and the SEM column each use one separate ion pump but one ion pump may be shared by both the columns.

An ion source 61 is located in the most upstream vacuum chamber of the FIB column 77 in which a non-evaporable getter pump 79 is placed. Also a non-evaporable getter pump 80 is placed in a downstream vacuum chamber on the other side of an opening in a static electron optics 63 and a vacuum chamber on the other side of an opening in a static electron optics 64 is evacuated by an ion pump 69. An ion beam emitted from the ion source 61 goes through the static electron optics 63, 64 and 65 and is focused on a target area of the sample surface to perform a given cutting process.

The present invention is applied to the SEM column 78 like the FIB column. An electron source 62 is located in the most upstream vacuum chamber in which a non-evaporable getter pump 81 is placed. Also a non-evaporable getter pump 82 is placed in a downstream vacuum chamber on the other side of an opening 66 and a vacuum chamber located more downstream is evacuated by an ion pump 70. Since the latter vacuum chamber incorporates an electromagnetic optics 67 which has a coil and is low in heat resistance, a non-evaporable getter pump cannot be placed in it. This structure is the same as the SEM column in the first embodiment. An electron beam emitted from the electron source 62 is focused on the surface of the sample 60 where secondary electrons are generated; the secondary electrons are detected by a secondary electron detector 76 to form an SEM image whether it is during or before/after ion beam processing.

Figure 16:
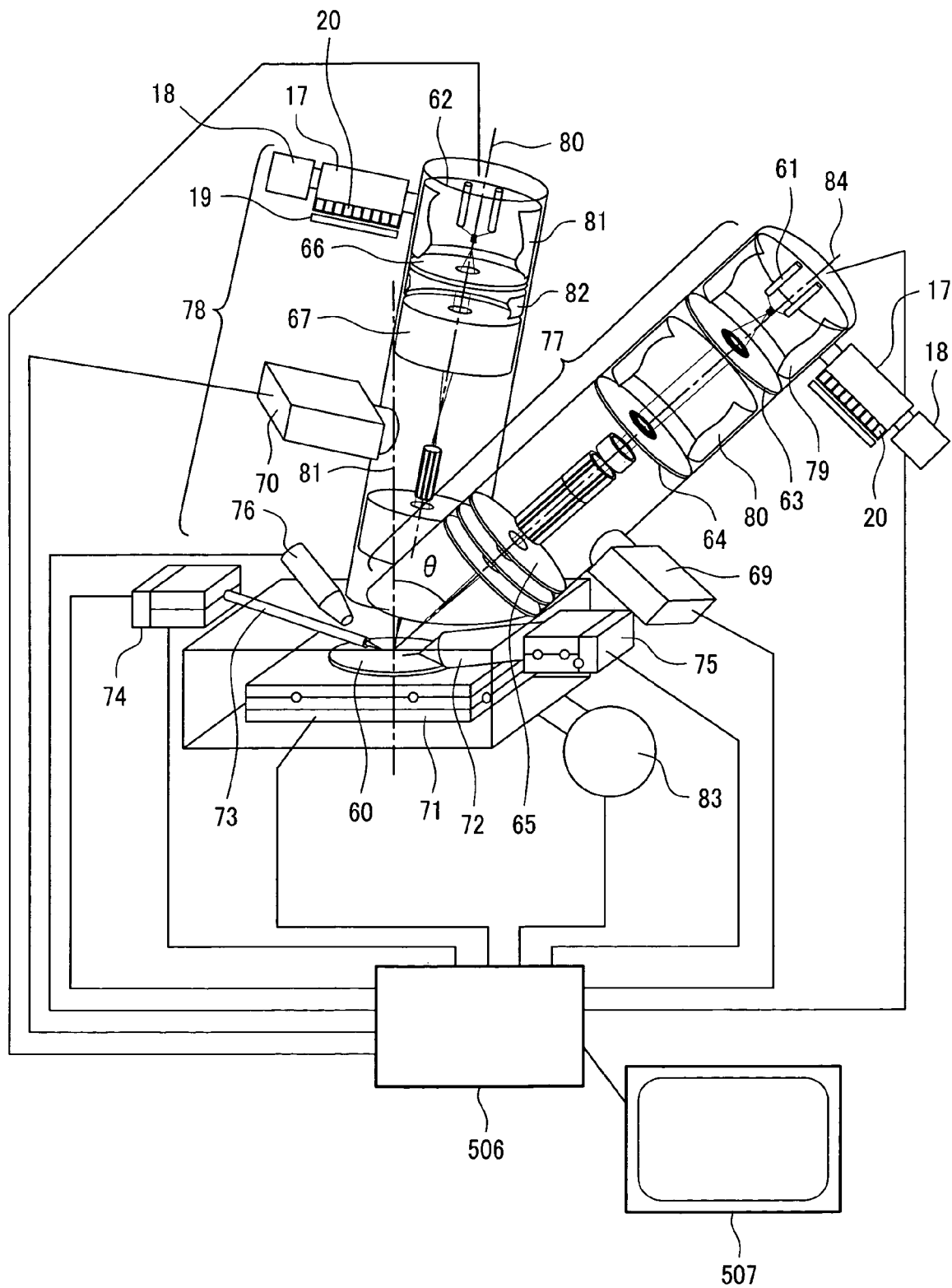
FIG. 16 illustrates the basic structure of a charged particle beam apparatus according to a sixth embodiment of the invention.

Since the ion source chamber of the FIB column 78 and the electron source chamber of the SEM column 77 require a high degree of vacuum as mentioned above, an auxiliary pump with pellets non-evaporable getter alloy 20 in the additional chamber 17 as shown in FIG. 16 is useful. This pump is far smaller and far lighter than an ion pump and when heated at a given temperature for a given time, at room temperature it achieves a pumping speed equivalent to or higher than the pumping speed which an ion pump would achieve.

The FIB column 77 is fixed in an inclined position where the angle θ of its central axis 84 to the vertical axis 81 is 30 degrees. The central axis 80 of the SEM column 78 is inclined by 45 degrees with respect to the vertical axis 81. The relative angle between the FIB column and the SEM column is 90 degrees.

Under the two columns is a sample chamber which is evacuated by a turbo-molecular pump 83. There are also a stage 71 which holds the sample 60 and moves and positions it, arms 72 and 73 for microsampling, and drive means 74 and 75 which drive them. These microsampling means are intended to handle a micro chip processed with an ion beam.

The above components are connected with control means 506 through signal lines so that the control means can receive and transmit control signals and image data. A display 507 may be used for user interfacing and display of an image.

As discussed so far, according to the present invention, it is possible to realize a compact charged particle beam apparatus, for example a compact scanning electron microscope, focused ion beam system or charged particle beam apparatus with plural columns, which maintains the degree of vacuum in a column incorporating an electron source at a high level of $10^{-8}$ Pa and generates few foreign particles.

What is claimed is:

1. A charged particle beam apparatus comprising:
a charged particle source;
a charged particle optics which focuses a charged particle beam emitted from the charged particle source on a sample and performs scanning; and
means of vacuum pumping which evacuates the charged particle optics,
wherein:
the means of vacuum pumping has a differential pumping structure with two or more vacuum chambers connected through an opening in series,
a pump made of non-evaporable getter alloy is placed in an upstream vacuum chamber with a high degree of vacuum, and
a gas absorbing surface of the non-evaporable getter alloy is fixed without contact with another part.

2. The charged particle beam apparatus according to claim 1, wherein the non-evaporable getter pump has a deposition of non-evaporable getter alloy on one side of a metal sheet.

3. The charged particle beam apparatus according to claim 1, wherein the non-evaporable getter pump is placed in the upstream vacuum chamber and the pump surface on which the non-evaporable getter alloy is deposited is on the vacuum side and the pump surface on which the non-evaporable getter alloy is not deposited is fixed in contact with an inner wall surface of the vacuum chamber with a high degree of vacuum.

4. The charged particle beam apparatus according to claim 1, wherein the side of the non-evaporable getter pump on which non-evaporable getter alloy is deposited has some areas without non-evaporable getter alloy and means for fixation is provided on the area and fixed in the upstream vacuum chamber.

5. The charged particle beam apparatus according to claim 1, wherein an additional chamber for the upstream vacuum chamber is provided and pellets made by binding non-evaporable getter alloy particles is placed in the additional chamber.

6. The charged particle beam apparatus according to claim 5, wherein a porous mesh is placed between the upstream vacuum chamber and the additional chamber.

7. The charged particle beam apparatus according to claim 5, wherein a heater is located on the lower surface of the additional chamber.

8. The charged particle beam apparatus according to claim 5, wherein a vacuum gauge is provided in the additional chamber.

9. The charged particle beam apparatus according to claim 5, wherein an opening between the additional chamber and the upstream vacuum chamber is in a position higher than the pellets.

10. The charged particle beam apparatus according to claim 1,
wherein:
the means of vacuum pumping has a differential pumping structure which is comprised of three or more vacuum chambers connected through an opening in series,
a pump made of non-evaporable getter alloy is placed in an upstream vacuum chamber with a high degree of vacuum,
a vacuum chamber which lies downstream of the upstream vacuum chamber and has a lower degree of vacuum than the upstream vacuum chamber is connected with a vacuum chamber which lies downstream of the downstream vacuum chamber and has a lower degree of vacuum than the downstream vacuum chamber through a valve which is able to adjust flow rate, and
a turbo-molecular pump is provided to evacuate the vacuum chamber which has the lowest degree of vacuum.

11. A charged particle beam apparatus comprising:
a charged particle source;
a charged particle optics which focuses a charged particle beam emitted from the charged particle source on a sample and performs scanning; and
means of vacuum pumping which evacuates the charged particle optics,
wherein:
the means of vacuum pumping has a differential pumping structure with two or more vacuum chambers connected through an opening in series, and
a second pump made of grained non-evaporable getter alloy with particles on the order of less than 10 millimeters is placed in an upstream vacuum chamber with a high degree of vacuum.

12. The charged particle beam apparatus according to claim 11, wherein:

a first pump made of non-evaporable getter alloy with finer particles than the grained non-evaporable getter alloy is placed in a first vacuum chamber with a high degree of vacuum located most upstream, and a second pump made of the grained non-evaporable getter alloy is placed in a second vacuum chamber which is located downstream of the first vacuum chamber and has a lower degree of vacuum than the first vacuum chamber.

13. The charged particle beam apparatus according to claim 12, wherein a gas absorbing surface of the non-evaporable getter alloy of the first pump is fixed without contact with another part, and the non-evaporable getter alloy particles of the second pump are held around a heater by mesh texture metal.

14. The charged particle beam apparatus according to claim 12, wherein the non-evaporable getter alloy of the second pump is comprised of particles of about 3 mm square.

15. The charged particle beam apparatus according to claim 14, wherein a surface of the non-evaporable getter alloy of the second pump has a convexo-concave shape with cycles of several microns to several dozen microns and has an increased effective surface area.

16. The charged particle beam apparatus according to claim 11, wherein the means of vacuum pumping has a differential pumping structure which is comprised of three or more vacuum chambers connected through an opening in series, and the vacuum chambers are connected by a rough pumping port and vacuum is controlled by a separate valve for each chamber.

17. The charged particle beam apparatus according to claim 1, wherein the charged beam source is a thermal field emitter electron gun.

18. A charged particle beam apparatus comprising:

an ion source;

an ion illumination optics which focuses an ion beam emitted from the ion source on a sample and performs scanning; and means of vacuum pumping which evacuates the ion illumination optics, a surface of the sample being processed by irradiation with the ion beam, wherein:

the means of vacuum pumping has a differential pumping structure with two or more vacuum chambers connected through an opening in series, a pump made of non-evaporable getter alloy is placed in an upstream vacuum chamber with a high degree of vacuum, and a gas absorbing surface of the non-evaporable getter alloy is fixed without contact with another part.

19. The charged particle beam apparatus according to claim 18, wherein the non-evaporable getter pump has a deposition of non-evaporable getter alloy on one side of a metal sheet.

20. The charged particle beam apparatus according to claim 18, wherein the non-evaporable getter pump is placed in the upstream vacuum chamber and the pump surface on which the non-evaporable getter alloy is deposited is on the vacuum side and the pump surface on which the non-evaporable getter alloy is not deposited is fixed in contact with an inner wall surface of the vacuum chamber with a high degree of vacuum.

* * * * *